(12) United States Patent
Sai

(10) Patent No.: US 8,957,735 B2
(45) Date of Patent: Feb. 17, 2015

(54) PHASE-LOCKED LOOP (PLL) CIRCUIT AND COMMUNICATION APPARATUS

(71) Applicant: Kabushiki Kaisha Toshiba, Tokyo (JP)

(72) Inventor: Akihide Sai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 52 days.

(21) Appl. No.: 13/872,752

(22) Filed: Apr. 29, 2013

(65) Prior Publication Data

US 2013/0335150 A1 Dec. 19, 2013

(30) Foreign Application Priority Data

Jun. 15, 2012 (JP) ................................. 2012-135752

(51) Int. Cl.
*H03L 1/00* (2006.01)
*H03L 7/08* (2006.01)
*H03L 7/099* (2006.01)

(52) U.S. Cl.
CPC ................ *H03L 7/0991* (2013.01); *H03L 1/00* (2013.01); *H03B 2202/042* (2013.01); *H03B 2201/038* (2013.01); *H03L 7/099* (2013.01); *H03L 2207/06* (2013.01); *H03L 2207/50* (2013.01)
USPC .................. 331/10; 327/156; 331/15; 331/17; 331/186; 375/376

(58) Field of Classification Search
CPC .................... H03B 2201/038; H03B 2202/042; H03L 1/00; H03L 5/00; H03L 5/02; H03L 7/08; H03L 7/0802; H03L 7/0991; H03L 2207/08; H03L 2207/50

USPC ........ 327/147, 156; 331/10, 15–17, 182, 183, 331/185, 186; 375/373–376
See application file for complete search history.

(56) References Cited

U.S. PATENT DOCUMENTS

| | | | |
|---|---|---|---|
| 7,042,302 B2 * | 5/2006 | Chien | 331/185 |
| 8,111,798 B2 * | 2/2012 | Sai | 375/375 |
| 2009/0002079 A1 * | 1/2009 | Venuti et al. | 331/10 |

OTHER PUBLICATIONS

"A 0.4-to-3 Ghz Digital PLL With PVT Insensitive Supply Noise Cancellation Using Deterministic Background Calibration": IEEE Journal of Solid-State Circuits: vol. 46, No. 12: Dec. 2011: pp. 1-13 (in English).

\* cited by examiner

*Primary Examiner* — Levi Gannon
(74) *Attorney, Agent, or Firm* — Holtz, Holtz, Goodman & Chick PC

(57) ABSTRACT

According to one embodiment, a phase locked loop (PLL) circuit includes an application unit, a correlator, an integrator and a power supply noise canceller. The application unit applies the test signal to a power supply voltage. The correlator extracts a frequency error signal as a monitor signal and calculates a correlation value for the test signal and the monitor signal to generate a correlation signal. The integrator integrates the correlation signal to generate an integral signal. The power supply noise canceller provides a cancellation gain corresponding to the integral signal to the power supply voltage to which the test signal is applied, to generate a control signal.

5 Claims, 8 Drawing Sheets

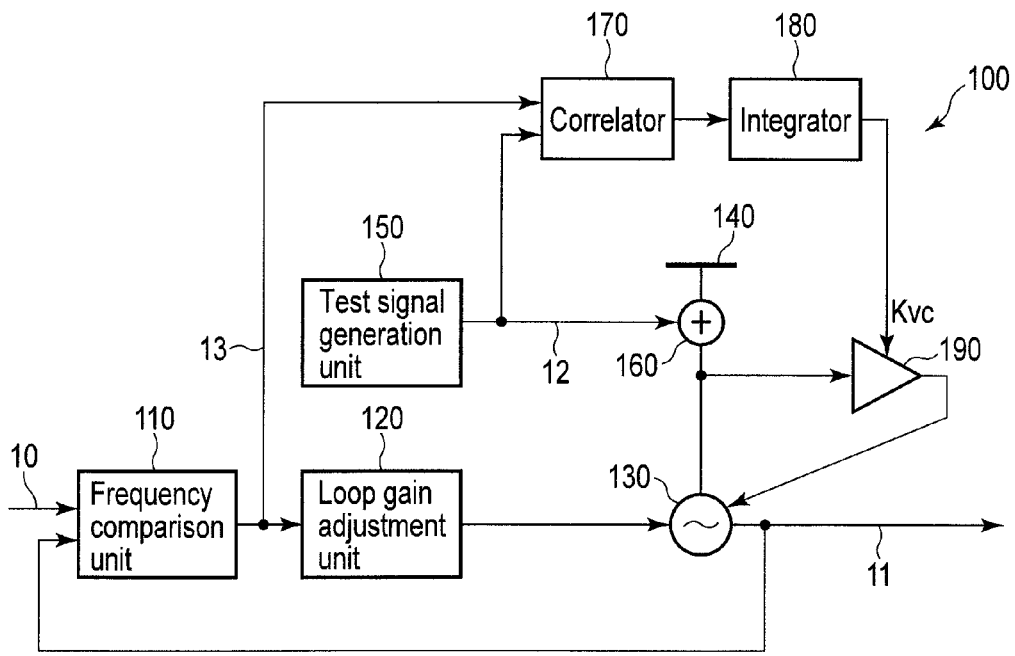
F I G. 1
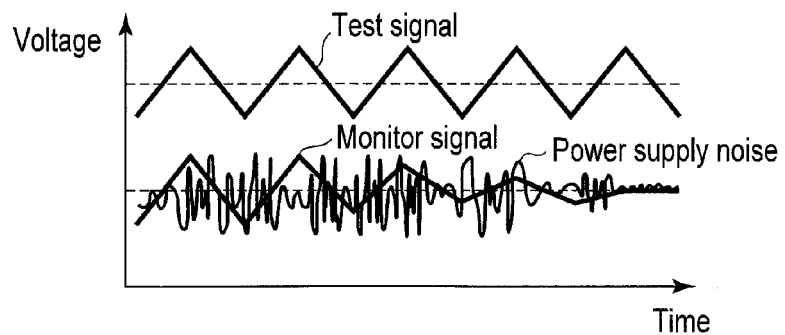
F I G. 2

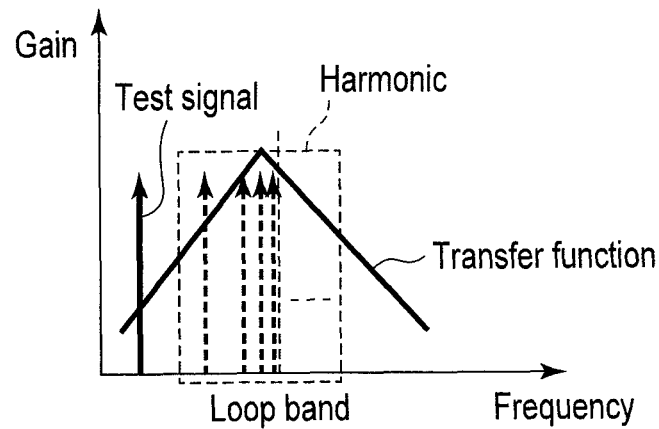
F I G. 5 A
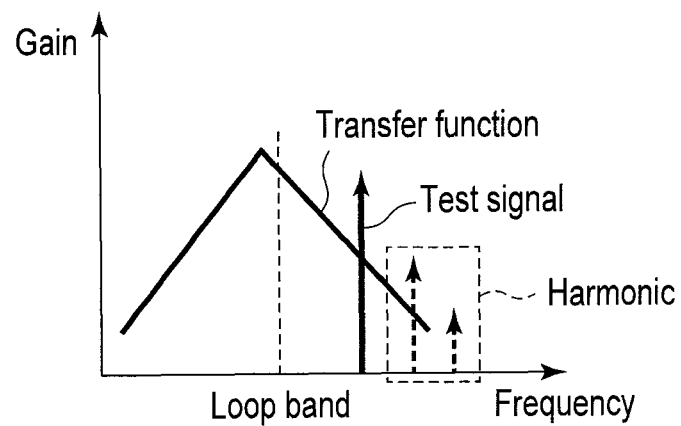
F I G. 5 B

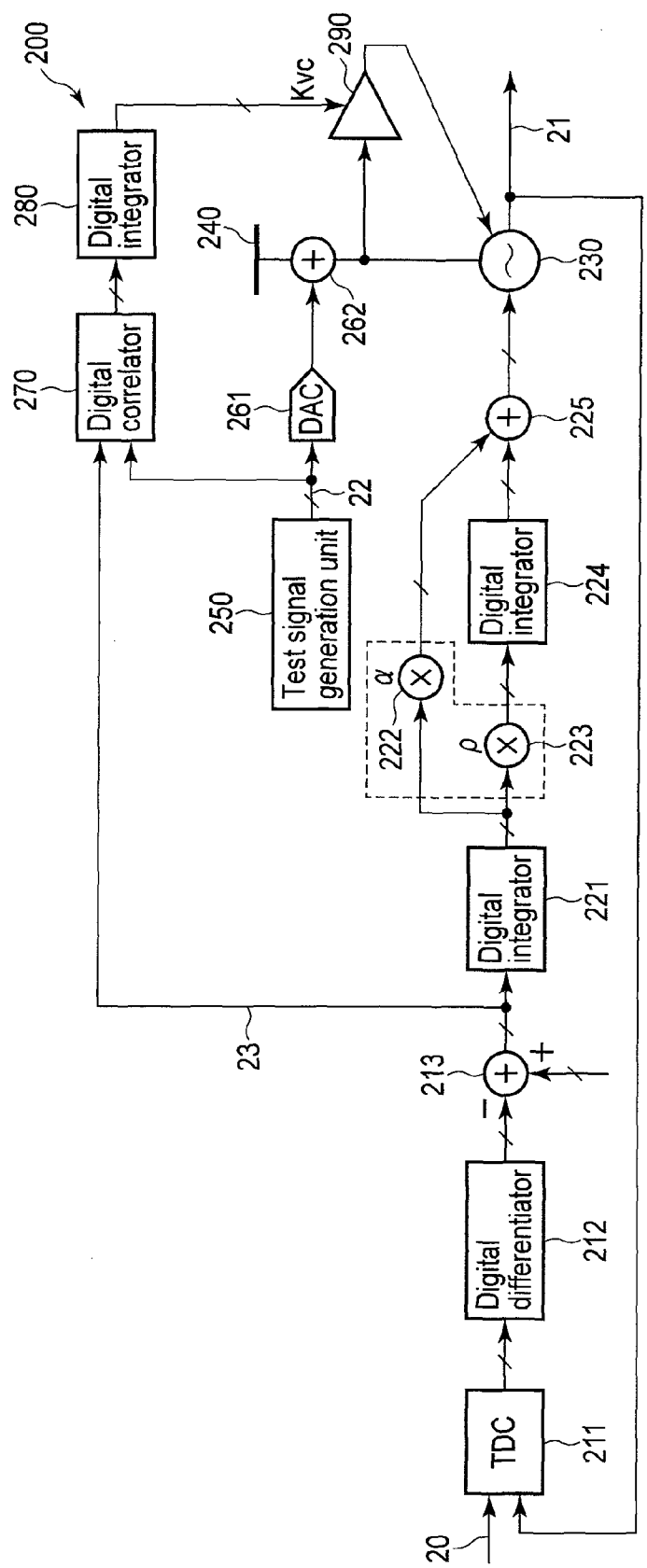
F I G. 6

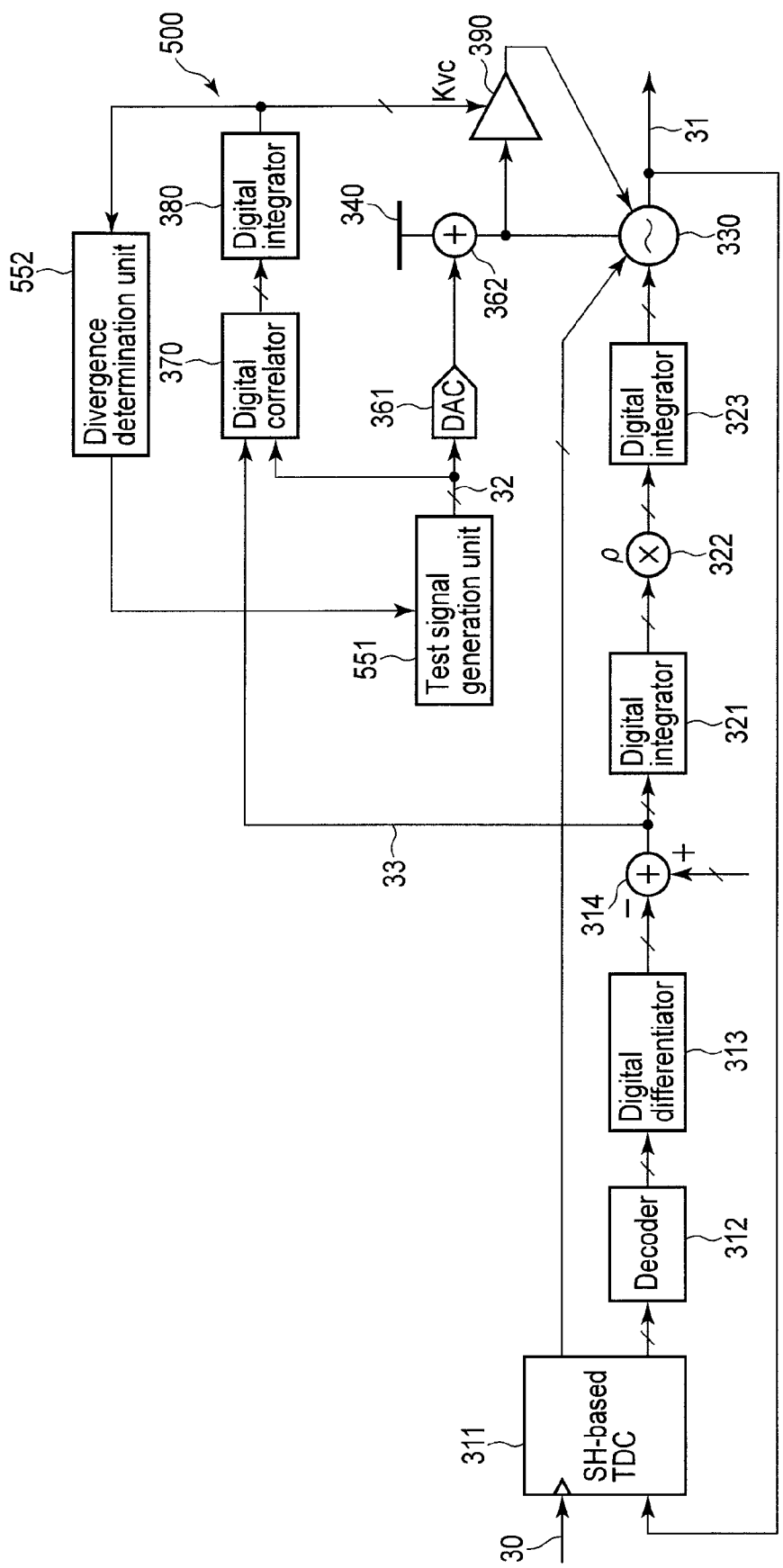
F I G. 11

US 8,957,735 B2

PHASE-LOCKED LOOP (PLL) CIRCUIT AND COMMUNICATION APPARATUS

CROSS-REFERENCE TO RELATED APPLICATIONS

This application is based upon and claims the benefit of priority from Japanese Patent Application No. 2012-135752, filed Jun. 15, 2012, the entire contents of which are incorporated herein by reference.

FIELD

Embodiments described herein relate generally to a phase-locked loop.

BACKGROUND

A phase-locked loop (PLL) circuit feedback-controls a controlled oscillator so that an oscillation signal generated by the controlled oscillator (or a signal with a frequency which is one-Nth of the frequency of the oscillation signal) has a frequency and a phase equal to the frequency and phase of a reference signal. Here, N denotes the frequency ratio of a desired signal to the reference signal. N may be an integer or a real number including an integer portion and a fractional portion. As the controlled oscillator provided in the PLL circuit, for example, a ring oscillator is used. The ring oscillator is sensitive to a power supply voltage. Thus, phase noise characteristics of the PLL circuit comprising the ring oscillator is likely to be degraded by power supply noise applied to the power supply voltage.

A combination of the power supply for the ring oscillator with a low-dropout (LDO) regulator enables the power supply noise immunity of the PLL circuit to be improved. However, disadvantageously, the use of the LDO regulator requires a capacitor which suppresses the power consumption of the LDO regulator and high-frequency noise from the LDO regulator.

The use of a power supply noise canceller also enables the power supply noise immunity of the PLL to be improved. The power supply noise canceller is formed using an analog circuit, and thus variations in parameters for the power supply noise canceller are preferably compensated for by calibration. Specifically, convergence of the PLL is followed by activation of a power supply noise cancellation loop including the power supply noise canceller. The convergence of the power supply noise cancellation loop completes the calibration of the power supply noise canceller. The calibration appropriately compensates for variations in the parameters for the analog circuit forming the power supply noise canceller, allowing the power supply noise canceller to function accurately. Hence, the frequency of the oscillation signal is robust against the power supply noise. In contrast, time required for the calibration delays the activation of the PLL circuit.

BRIEF DESCRIPTION OF THE DRAWINGS

FIG. 1 is a diagram illustrating a PLL circuit according to a first embodiment;
FIG. 2 is a diagram illustrating a test signal and a monitor signal;
FIG. 5A is a diagram illustrating a harmonic component contained in the test signal in the comparative example;
FIG. 5B is a diagram illustrating a harmonic component contained in the test signal according to the first embodiment;
FIG. 6 is a diagram illustrating a PLL circuit according to a second embodiment;
FIG. 11 is a diagram illustrating a PLL circuit according to a fourth embodiment.

DETAILED DESCRIPTION

Figure 3:
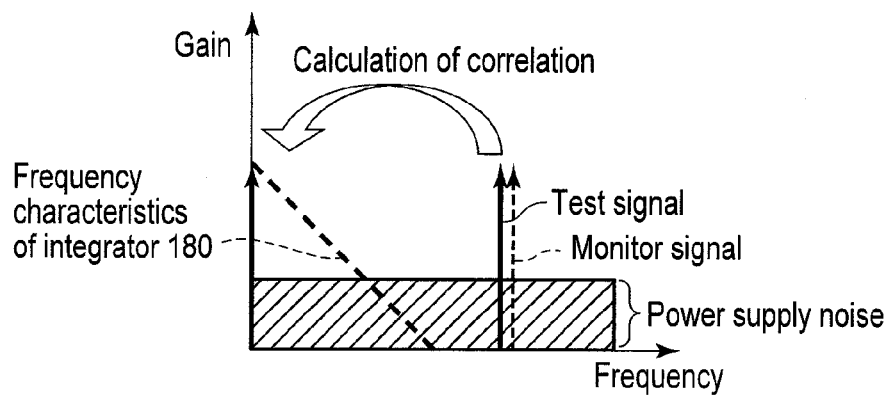
FIG. 3 is a diagram illustrating the test signal and the monitor signal.

Embodiments will be described below with reference to the drawings.

In general, according to one embodiment, a phase locked loop (PLL) circuit includes a controlled oscillator, a frequency comparison unit, a loop gain adjustment unit, a generation unit, an application unit, a correlator, an integrator and a power supply noise canceller. The controlled oscillator includes at least a first control terminal and a second control terminal and generates an oscillation signal with a frequency corresponding to a first control signal and a second control signal which are input via the first control terminal and the second control terminal, respectively. The frequency comparison unit compares a reference signal with the oscillation signal to obtain a frequency error signal indicative of an error in a frequency of the oscillation signal with respect to a desired value. The loop gain adjustment unit adjusts gain of the frequency error signal to obtain the first control signal. The generation unit generates a test signal with a frequency higher than a loop band of a PLL formed by the controlled oscillator, the frequency comparison unit, and the loop gain adjustment unit after the PLL converges. The application unit applies the test signal to a power supply voltage to be supplied to the controlled oscillator. The correlator extracts the frequency error signal as a monitor signal and calculates a correlation value for the test signal and the monitor signal to generate a correlation signal. The integrator integrates the correlation signal to generate an integral signal. The power supply noise canceller provides a cancellation gain corresponding to the integral signal to the power supply voltage to which the test signal is applied, to generate the second control signal.

Elements which are the same as or similar to described corresponding elements are denoted by the same or similar reference numbers. Duplicate descriptions are basically omitted.

First Embodiment

As shown in FIG. 1, a PLL circuit 100 according to a first embodiment comprises a frequency comparison unit 110, a loop gain adjustment unit 120, a controlled oscillator 130, a power supply 140, a test signal generation unit 150, a test signal application unit 160, a correlator 170, an integrator 180, and a power supply noise canceller 190.

The frequency comparison unit 110, the loop gain adjustment unit 120, and the controlled oscillator 130 form a PLL. A PLL operation makes the frequency of an oscillation signal 11 generated by the controlled oscillator 130 equal to a desired value (the value obtained by multiplying the frequency of the reference signal by a desired ratio).

The frequency comparison unit 110 inputs the oscillation signal 11 from the controlled oscillator 130 and also inputs a reference signal 10 from a reference signal generation unit (not shown in the drawings). The frequency comparison unit 110 compares the reference signal 10 and the oscillation signal 11 (or a signal with a frequency which is one-Nth of the frequency of the oscillation signal 11) with each other to obtain a frequency error signal indicative of a frequency error in the oscillation signal 11 with respect to a desired value. Here, N denotes the above-described desired ratio. N may be an integer or a real number including an integral portion and a fractional portion. If the PLL circuit 100 is locked (that is, the PLL has converged), the frequency of the oscillation signal 11 is equal to the frequency of the reference signal 10 multiplied by N. The frequency comparison unit 110 outputs a frequency error signal to the loop gain adjustment unit 120. Furthermore, the frequency comparison unit 110 outputs the frequency error signal to the correlator 170 as a monitor signal 13 as described below.

The frequency comparison unit 110 may be formed using an analog circuit. For example, the frequency comparison unit 110 may be formed using a frequency divider for dividing the frequency of the oscillation signal 11 with N, and a phase frequency detector (PFD) for detecting a frequency error between the reference signal 10 and the oscillation signal 11 subjected to the frequency division.

Alternatively, the frequency comparison unit 110 may be formed using a digital circuit. For example, the frequency comparison unit 110 may be formed using a time-to-digital converter (TDC) (which may also be referred to as a phase-to-digital converter), a counter, a digital differentiator, and a digital subtractor.

The loop gain adjustment unit 120 inputs a frequency error signal from the frequency comparison unit 110. The loop gain adjustment unit 120 adjusts the gain of the frequency error signal to generate a first control signal. The loop gain adjustment unit 120 outputs the first control signal to a first control terminal of the controlled oscillator 130 described below.

The loop gain adjustment unit 120 may be formed using an analog circuit. For example, the loop gain adjustment unit 120 may be formed using a charge pump and a loop filter. Alternatively, the loop gain adjustment unit 120 may be formed using a digital circuit. For example, the loop gain adjustment unit 120 may be formed using a bit shift circuit, a digital integrator, and a digital filter.

The controlled oscillator 130 is connected to the power supply 140 via the test signal application unit 160. The controlled oscillator 130 comprises at least two control terminals including a first control terminal and a second control terminal. The controlled oscillator 130 inputs the first control signal from the loop gain adjustment unit 120 via the first control terminal. The controlled oscillator 130 inputs a second control signal from the power supply noise canceller 190 via the second control terminal.

The controlled oscillator 130 generates an oscillation signal 11 with a frequency corresponding to the signal value of an input signal to each of the control terminals. For example, if the controlled oscillator 130 is a voltage controlled oscillator (VCO), the oscillation signal 11 has a frequency corresponding to the voltage of an input signal via each of the control terminals of the controlled oscillator 130. The controlled oscillator 130 is, for example, a ring oscillator but is not limited to this. The controlled oscillator 130 outputs the oscillation signal 11 to the frequency comparison unit 110 via an output terminal of the controlled oscillator 130. The frequency of the oscillation signal 11 is feedback-controlled so as to reduce the above-described frequency error. Moreover, the controlled oscillator 130 outputs the oscillation signal 11 to the outside of the PLL circuit 100 via the output terminal of the controlled oscillator 130.

The power source 140 supplies a power supply voltage to the controlled oscillator 130 via the test signal application unit 160. The test signal generation unit 150 described below does not operate until the PLL converges. Thus, the test signal application unit 160 is negligible.

The convergence of the PLL is followed by activation of the power supply noise cancellation loop. Specifically, the convergence of the PLL is followed by activation of the test signal generation unit 150, the test signal application unit 160, the correlator 170, the integrator 180, and the power supply noise canceller 190. The convergence of the power supply noise cancellation loop completes the calibration of the power supply noise canceller 190.

The test signal generator 150 generates a test signal 12. The test signal generator 150 outputs the test signal 12 to the test signal application unit 160 and the correlator 170. The test signal 12 may be generated so as to have any waveform such as a square wave, a triangle wave, or a sine wave. In general, the triangle wave or the square wave can be generated more easily than the sine wave. That is, the test signal generation unit 150 can be implemented more easily when the test signal 12 is the square wave or the triangle wave than when the test signal 12 is the sine wave.

The test signal application unit 160 inputs the test signal 12 from the test signal generation unit 150. The test signal application unit 160 applies the test signal 12 to the power supply voltage to be supplied to the controlled oscillator 130 by the power supply 140. As a result, the frequency of the oscillation signal 11 varies periodically depending on the frequency of the test signal 12.

The correlator 170 inputs the frequency error signal from the frequency comparison unit 110 as a monitor signal 13. The correlator 170 inputs the test signal 12 from the test signal generation unit 150. As shown in FIG. 2, the monitor signal 13 varies periodically depending on the frequency of the test signal 12, but the variation of the monitor signal converges as the calibration progresses. Moreover, the monitor signal 13 also varies when instead of the test signal, power supply noise is superposed on the monitor signal 13. The correlator 170 calculates a correlation value for the test signal 12 and the monitor signal 13 to obtain a correlation signal indicative of the correction value. The correlator 170 outputs the correlation signal to the integrator 180. The correlator 170 may be a multiplier which calculates the product of the test signal 12 and the monitor signal 13.

For example, if the product of the test signal 12 and the monitor signal 13 is used as the correlation value, then as shown in FIG. 3, a frequency component of the monitor signal 13 which is the same as a frequency component of the test signal 12 is converted into a direct current component of the correlation signal. The monitor signal 13 contains a frequency component different from any of the frequency components of the test signal 12 owing to the effect of the power supply noise. However, such a frequency is converted into a frequency component other than the direct current component of the correlation signal (specifically, a difference frequency component between the monitor signal 13 and the test signal 12).

The integrator 180 inputs the correlation signal from the correlator 170. The integrator 180 integrates the correlation signal to obtain an integral signal indicative of the integral value of the correlation signal. The integrator 180 outputs the integral signal to the power supply noise canceller 190. The integrator 180 suppresses the frequency components other than the direct current component as illustrated in FIG. 3. Thus, those frequency components of the power supply noise which are different from the frequency components of the test signal 12 are basically negligible. The direct current component of the correlation signal approaches zero as the calibration progresses. A zero direct current component of the correlation signal means a zero amplitude of the monitor signal 13. This means that the frequency of the oscillation signal 11 is stabilized in spite of a variation in power supply voltage due to the test signal 12 and the power supply noise, resulting in the convergence of the power supply noise cancellation loop.

The power supply noise canceller 190 inputs the power supply voltage with the test signal 12 applied thereto by the test signal application unit 160. The power supply noise canceller 190 provides a cancellation gain to the power supply voltage with the test signal 12 applied thereto, to obtain a second control signal. The cancellation gain is controlled by the integral signal from the integrator 180. The power supply noise canceller 190 outputs the second control signal to the second control terminal of the controlled oscillator 130.

As described above, the calibration of the power supply noise canceller 190 is achieved by generating the correlation signal (for example, the multiplication of the test signal 12 and the monitor signal 13) carried out by the correlator 170 and the integration of the direct current component of the correlation signal carried out by the integrator 180. Here, a band which can be set for the integrator 180 is limited by the frequency of the test signal 12. Hence, the time required for the calibration by the power supply noise canceller 190 (the time required for the convergence of the power supply noise cancellation loop) depends significantly on the test signal 12. An increase in the frequency of the test signal 12 extends the band which can be set for the integrator 180, allowing the calibration time to be shortened.

Figure 4A:
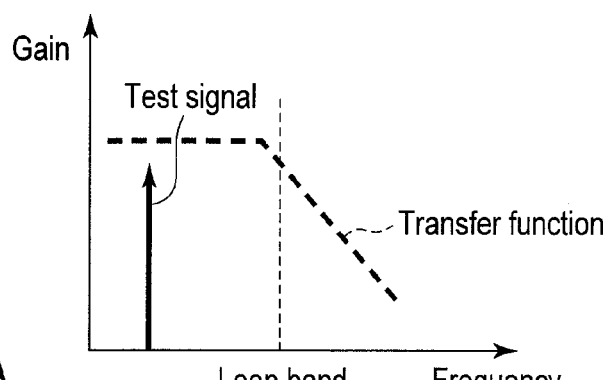
FIG. 4A is a diagram illustrating the frequency of a test signal in a comparative example.

However, the frequency which can be set for the test signal 12 is limited by the frequency characteristics of the monitor signal 13. For example, it is assumed that the output signal from the loop gain adjustment unit 120 is extracted as a monitor signal for comparison. Here, the following corresponds to a low-pass filter: a transfer function for the extraction, as the monitor signal for comparison, of the test signal 12 input by the test signal application unit 160, from the loop gain adjustment unit 120 via the power supply noise canceller 190, the controlled oscillator 130, and the frequency control unit 110. The cutoff frequency of the transfer function is approximately equal to the loop band of the PLL. If the frequency of the test signal 12 is set higher than the loop band of the PLL, the monitor signal for comparison is suppressed in accordance with the transfer function, preventing the correlation signal from being appropriately generated. Thus, as illustrated in FIG. 4A, the frequency of the test signal 12 needs to be set lower than the loop band of the PLL. This makes the shortening of the calibration time difficult.

Figure 4B:
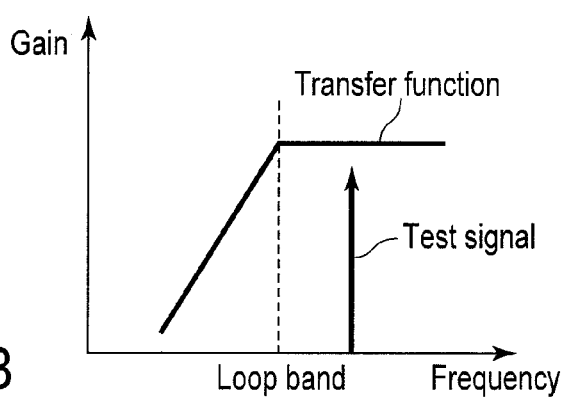
FIG. 4B is a diagram illustrating the frequency of a test signal according to the first embodiment.

On the other hand, the following corresponds to a high-pass filter: a transfer function for the extraction, as the monitor signal 13, of the test signal 12 input by the test signal application unit 160, from the frequency comparison unit 110 via the power supply noise canceller 190 and the controlled oscillator 130. The cutoff frequency of the transfer function is approximately equal to the loop band of the PLL. According to the transfer function, those frequencies which are higher than the loop band correspond to a pass band. This allows the frequency of the test signal to be set higher than the loop band as illustrated in FIG. 4B. That is, the calibration time can be shortened.

Moreover, the frequency of the test signal 12 is preferably increased in connection with the phase noise characteristics of the PLL circuit 100. If the test signal 12 is a rectangle wave or a triangle wave, the test signal 12 has a plurality of harmonic components in addition to a fundamental frequency. When the plurality of harmonic components appear near the loop band of the PLL, the phase noise characteristics of the PLL circuit 100 are degraded.

The following corresponds to a band pass filter: a transfer function for the extraction, as the oscillation signal 11, of the test signal 12 input by the test signal application unit 160, from the controlled oscillator 130 via the power supply noise canceller 190. The lower cutoff frequency, upper cutoff frequency, and central frequency of the transfer function are approximately equal the loop band.

Setting the frequency of the test signal 12 lower than the loop band allows the harmonic components of the test signal 12 to appear easily near the peak of the transfer function (that is, near the loop band) as shown in FIG. 5A. That is, the phase noise characteristics of the PLL circuit 100 are likely to be degraded. On the other hand, setting the frequency of the test signal 12 higher than the loop band prevents the harmonic components of the test signal 12 from appearing near the peak of the transfer function as shown in FIG. 5B. The harmonic components are suppressed in accordance with the transfer function. That is, the degradation of the phase noise characteristics of the PLL circuit is suppressed.

As described above, the PLL circuit according to the first embodiment extracts the frequency error signal as the monitor signal. Hence, the PLL circuit provides the available test signal with a high frequency. That is, the PLL circuit allows a wide band to be set for the integrator in the power supply noise cancellation loop, enabling a reduction in the calibration time of the power supply noise canceller. Furthermore, even if the test signal contains harmonic components, the PLL circuit suppresses the degradation of the phase noise characteristics caused by the harmonic components.

Second Embodiment

As illustrated in FIG. 6, a PLL circuit 200 according to a second embodiment comprises a TDC 211, a digital differentiator 212, a digital subtractor 213, a digital integrator 221, gain adjustment units 222 and 223, a digital integrator 224, a digital adder 225, a controlled oscillator 230, a power supply 240, a test signal generation unit 250, a digital-to-analog converter (DAC) 261, a test signal application unit 262, a digital correlator 270, a digital integrator 280, and a power supply noise canceller 290.

A PLL is formed of the TDC 211, digital differentiator 212, the digital subtractor 213, the digital integrator 221, the gain adjustment units 222 and 223, the digital integrator 224, the digital adder 225, and the controlled oscillator 230. A PLL operation makes the frequency of an oscillation signal 21 generated by the controlled oscillator 230 equal to a desired value (the frequency of a reference signal 20 multiplied by a desired ratio [=N]). According to the present embodiment, the desired ratio is specified by a frequency setting code also referred to as a frequency command word (FCW). If the PLL circuit 200 is locked (that is, the PLL has converged), the frequency of the oscillation signal 21 is equal to the frequency of the reference signal 20 multiplied by N.

The TDC 211 inputs the oscillation signal 21 from the controlled oscillator 230 and also inputs the reference signal 20 from a reference signal generation unit (not shown in the drawings) via a clock terminal of the TDC 211. The TDC 211 detects the phase of the oscillation signal 21 in response to a rising edge or a falling edge of the reference signal 20. The TDC 211 outputs a phase signal indicative of phase to the digital differentiator 212.

The digital differentiator 212 inputs the phase signal from the TDC 211. The digital differentiator 212 differentiates the phase signal to obtain a frequency signal indicative of the frequency of the oscillation signal 21. The digital differentiator 212 outputs the frequency signal to the digital subtractor 213.

The digital subtractor 213 inputs the frequency setting code and also inputs the frequency signal from the digital differentiator 212. The digital subtractor 213 calculates the difference between the frequency setting code and the frequency signal to obtain a digital frequency error signal indicative of an error in the frequency of the oscillation signal 21. The digital subtractor 213 outputs the frequency error signal to the digital integrator 221. Furthermore, the digital subtractor 213 outputs the frequency error signal to the digital correlator 270 as a monitor signal 23 as described below.

The digital integrator 221 inputs the frequency error signal from the digital subtractor 213. The digital integrator 221 integrates the frequency error signal to obtain a phase error signal indicative of an error in the phase of the oscillation signal 21. The digital integrator 221 outputs the phase error signal to the gain adjustment units 222 and 223. Here, the gain adjustment unit 222 forms what is called a proportional path. The gain adjustment unit 223 and the digital integrator 224 described below form what is called an integral path.

The gain adjustment unit 222 inputs the phase error signal from the digital integrator 221. The gain adjustment unit 222 provides a first adjustment gain ($=\alpha$) to the phase error signal to obtain a first adjustment signal. The gain adjustment unit 222 outputs the first adjustment signal to the digital adder 225.

The gain adjustment unit 223 inputs the phase error signal from the digital integrator 221. The gain adjustment unit 223 provides a second adjustment gain ($=\rho$) to the phase error signal to obtain a second adjustment signal. The gain adjustment unit 222 outputs the second adjustment signal to the digital integrator 224.

The digital integrator 224 inputs the second adjustment signal from the gain adjustment unit 223. The digital integrator 224 integrates the second adjustment signal to obtain a third adjustment signal. The digital integrator 224 outputs the third adjustment signal to the digital adder 225.

The digital adder 225 inputs the first adjustment signal from the gain adjustment unit 222 and also inputs the third adjustment signal from the digital integrator 224. The digital adder 225 adds the first adjustment signal and the third adjustment signal together to obtain a first control signal. The digital adder 225 outputs the first control signal to the first control terminal of the controlled oscillator 230 described below.

The controlled oscillator 230 is connected to the power supply 240 via the test signal application unit 262 described below. The controlled oscillator 230 includes at least two control terminals including a first control terminal and a second control terminal. The controlled oscillator 230 inputs the first control signal from the digital adder 225 via the first control terminal of the controlled oscillator 230. The controlled oscillator 230 inputs the second control signal from the power supply noise canceller 290 described below, via the second control terminal.

The controlled oscillator 230 generates the oscillation signal 21 with a frequency corresponding to the signal value of an input signal to each of the control terminals of the controlled oscillator 230. For example, if the controlled oscillator 230 is a VCO, the oscillation signal 21 has a frequency corresponding to the voltage of an input signal to each of the control terminals of the controlled oscillator 230. The controlled oscillator 230 is, for example, a ring oscillator but is not limited to this. The controlled oscillator 230 outputs the oscillation signal 21 to the TDC 211 via an output terminal of the controlled oscillator 230. The frequency of the oscillation signal 21 is feedback-controlled so as to reduce the above-described frequency error. Moreover, the controlled oscillator 230 outputs the oscillation signal 21 to the outside of the PLL circuit 200 via the output terminal of the controlled oscillator 230.

The power source 240 supplies a power supply voltage to the controlled oscillator 230 via the test signal application unit 262. The test signal generation unit 250 described below does not operate until the PLL converges. Thus, the test signal application unit 262 is negligible.

The convergence of the PLL is followed by the power supply noise cancellation loop. Specifically, the convergence of the PLL is followed by activation of the test signal generation unit 250, the DAC 261, the test signal application unit 262, the digital correlator 270, the digital integrator 280, and the power supply noise canceller 290. The convergence of the power supply noise cancellation loop completes the calibration of the power supply noise canceller 290.

The test signal generation unit 250 is formed using a digital circuit. The test signal generation unit 250 generates a digital test signal 22. The test signal generation unit 250 outputs the test signal 22 to the DAC 261 and the digital correlator 270. Like the test signal 12, the test signal 22 may be generated so as to have a frequency higher than the loop band and any waveform such as a square wave, a triangle wave, or a sine wave.

The DAC 261 inputs the digital test signal 22 from the test signal generation unit 250. To apply the test signal 22 to the power supply voltage, the DAC 261 converts the test signal 22 into an analog test signal. The DAC 261 outputs the analog test signal to the test signal application unit 262.

The test signal application unit 262 inputs the analog test signal from the DAC 261. The test signal application unit 262 applies the analog test signal to the power supply voltage to be supplied to the controlled oscillator 230 by the power supply 240. As a result, the frequency of the oscillation signal 21 varies periodically depending on the frequency of the test signal 22.

The digital correlator 270 is formed using a digital circuit. The digital correlator 270 inputs the digital frequency error signal from the digital subtractor 213 as the digital monitor signal 23. The digital correlator 270 inputs the digital test signal 22 from the test signal generation unit 250. The digital correlator 270 calculates a correlation value for the test signal 22 and the monitor signal 23 to obtain a digital correlation signal indicative of the correction value. The digital correlator 270 outputs the correlation signal to the digital integrator 280.

The digital integrator 280 is formed using a digital circuit. The digital integrator 280 inputs the digital correlation signal from the digital correlator 270. The digital integrator 280 integrates the correlation signal to obtain a digital integral signal indicative of the integral value of the correlation signal. The digital integrator 280 outputs the integral signal to the power supply noise canceller 290. The digital integrator 280 suppresses the frequency components other than a direct current component. Thus, those frequency components of the power supply noise which are different from the frequency components of the test signal 12 are basically negligible. The direct current component of the correlation signal approaches zero as the calibration progresses. A zero direct current component of the correlation signal means a zero amplitude of the monitor signal 23. This means that the frequency of the oscillation signal 21 is stabilized in spite of a variation in power supply voltage due to the test signal 12 and the power supply noise, resulting in the convergence of the power supply noise cancellation loop.

The power supply noise canceller 290 inputs the power supply voltage with the test signal 22 applied thereto by the DAC 261 and the test signal application unit 262. The power supply noise canceller 290 provides a cancellation gain to the power supply voltage with the test signal 22 applied thereto, to obtain a second control signal. The cancellation gain is controlled by the digital integral signal from the digital integrator 280. The power supply noise canceller 290 outputs the second control signal to the second control terminal of the controlled oscillator 230.

As described above, the PLL circuit according to the second embodiment extracts the frequency error signal as the monitor signal. Hence, the PLL circuit provides the available test signal with a high frequency. That is, the PLL circuit allows a wide band to be set for the integrator in the power supply noise cancellation loop, enabling a reduction in the calibration time of the power supply noise canceller. Furthermore, even if the test signal contains harmonic components, the PLL circuit suppresses the degradation of the phase noise characteristics caused by the harmonic components. Moreover, in the PLL circuit, the test signal generation unit, digital correlator, and digital integrator included in the power supply noise cancellation loop are formed using digital circuits. Hence, the PLL circuit allows the area and power consumption thereof to be reduced more easily than when the test signal generation unit, the digital correlator, and the digital integrator are formed using analog circuits.

Third Embodiment

Figure 7:
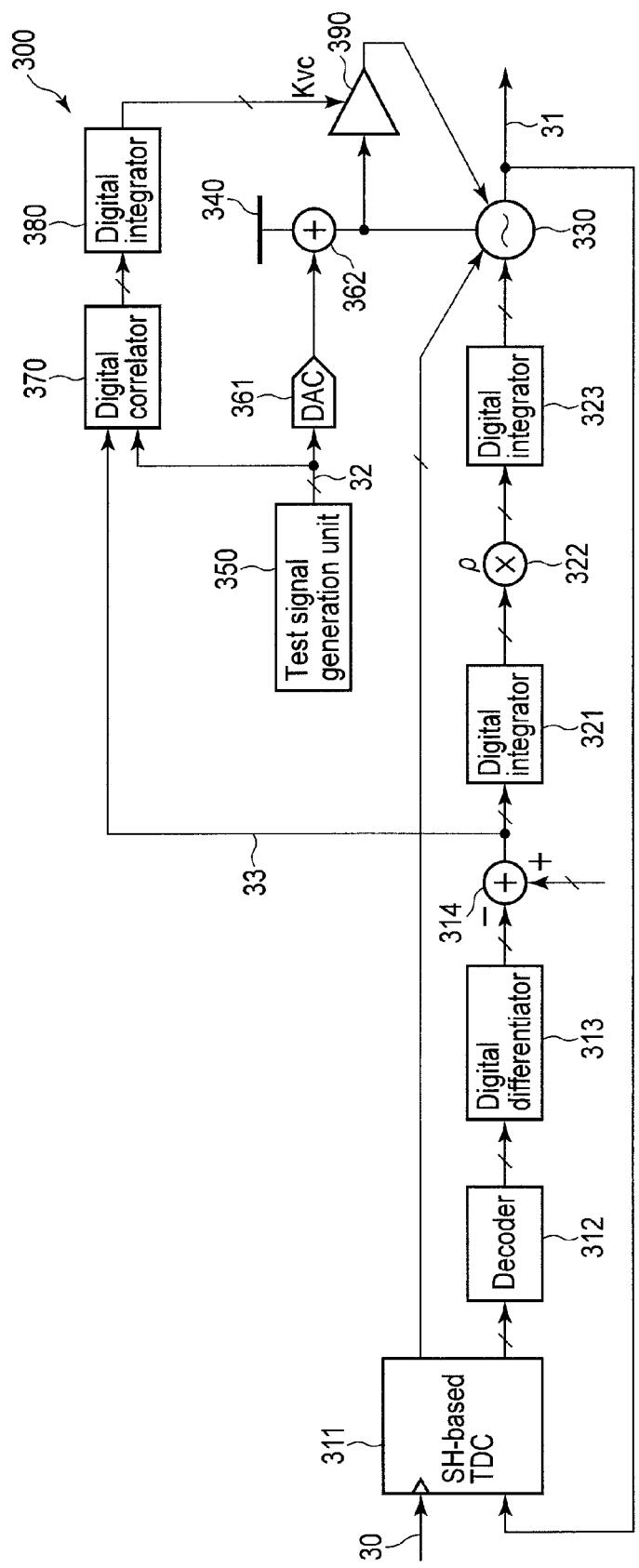
FIG. 7 is a diagram illustrating a PLL circuit according to a third embodiment.

As illustrated in FIG. 7, a PLL circuit 300 according to a third embodiment comprises a PLL circuit 300, a sample-and-hold (SH)-based TDC 311, a decoder 312, a digital differentiator 313, a digital subtractor 314, a digital integrator 321, a gain adjustment unit 322, a digital integrator 323, a controlled oscillator 330, a power supply 340, a test signal generation unit 350, a DAC 361, a test signal application unit 362, a digital correlator 370, a digital integrator 380, and power supply noise canceller 390.

A PLL is formed by the SH-based TDC 311, the decoder 312, the digital differentiator 313, the digital subtractor 314, the digital integrator 321, the gain adjustment unit 322, the digital integrator 323, and the controlled oscillator 330. A PLL operation makes each of the frequencies of 2m-phase oscillation signals 31 (m is an integer of at least 2) generated by the controlled oscillator 330 equal to a desired value (the frequency of a reference signal 30 multiplied by a desired ratio [=N]). The 2m-phase oscillation signals 31 are different from one another in phase but are the same in frequency. Hence, each of the frequencies of 2m-phase oscillation signals 31 is hereinafter simply referred to as the frequency of the oscillation signal 31. According to the present embodiment, the desired ratio is specified by the frequency setting code also referred to as the frequency command word (FCW). If the PLL circuit 300 is locked, the frequency of the oscillation signal 31 is equal to the frequency of the reference signal 30 multiplied by N.

The SH-based TDC 311 inputs the 2m-phase oscillation signals 31 from the controlled oscillator 330 and also inputs the reference signal 30 from a reference signal generation unit (not shown in the drawings) via a clock terminal of the SH-based TDC 311. The SH-based TDC 311 samples the 2m-phase oscillation signals 31 in response to a rising edge or a falling edge of the reference signal 30. The SH-based TDC 311 detects the phase of any one of the sampled 2m-phase oscillation signals. The SH-based TDC 311 outputs a first phase signal with m bits which is indicative of phase to the decoder 312. Furthermore, the SH-based TDC 311 outputs any one of the sampled 2m-phase oscillation signals 31, as a third control signal, to a third control terminal of the controlled oscillator 330 described below. Here, a signal path from the SH-based TDC 311 to the third control terminal of the controlled oscillator 330 corresponds to what is called a proportional path.

The SH-based TDC 311 is based on the operational principle of a sampling phase detector. The SH-based TDC 311 has the advantages of increasing a conversion gain and reducing phase noise in the loop band incorporated in the PLL.

Figure 8:
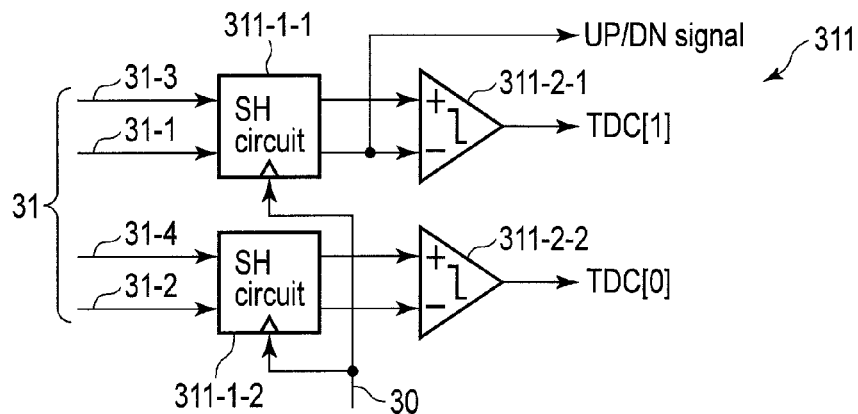
FIG. 8 is a diagram illustrating an SH-based TDC in FIG. 7.
Figure 9:
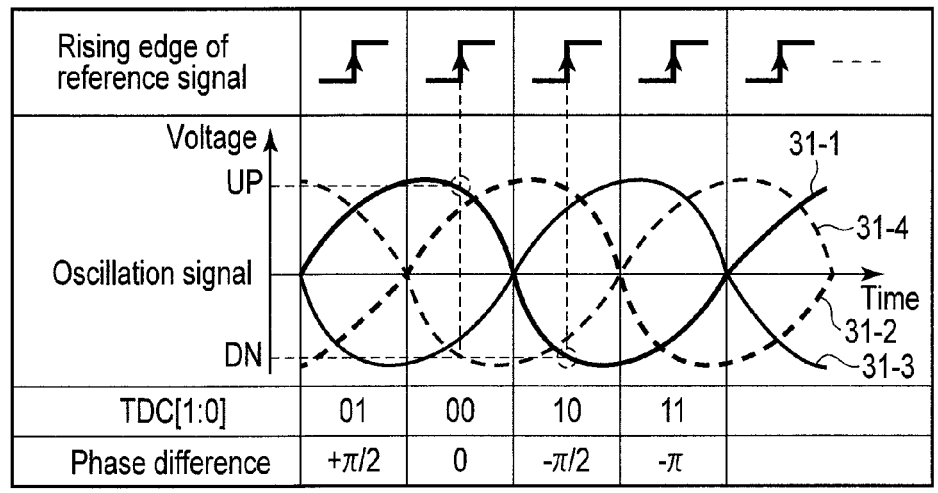
FIG. 9 is a diagram illustrating operation of the SH-based TDC in FIG. 8.

The SH-based TDC 311 includes m SH circuits and m quantizers (also referred to as comparators). For m=2, the SH-based TDC 311 includes SH circuits 311-1-1 and 311-1-2, quantizers 311-2-1 and 311-2-2, as illustrated in FIG. 8. The SH-based TDC 311 inputs four-phase oscillation signals 31. The four-phase oscillation signals 31 are composed of a first oscillation signal 31-1, a second oscillation signal 31-2, a third oscillation signal 31-3, and a fourth oscillation signal 31-4. As illustrated in FIG. 9, the phase of the second oscillation signal 31-2 lags that of the first oscillation signal 31-1 by $\pi/2$. Furthermore, the phase of the third oscillation signal 31-3 lags that of the second oscillation signal 31-2 by $\pi/2$. Moreover, the phase of the fourth oscillation signal 31-4 lags that of the third oscillation signal 31-3 by $\pi/2$.

The four-phase oscillation signals 31 include a differential pair of the first oscillation signal 31-1 and the third oscillation signal 31-3 and a differential pair of the second oscillation signal 31-2 and the fourth oscillation signal 31-4. In general, the 2m-phase oscillation signals 31 include m differential pairs which are different from one another in phase by $\pi$. SH circuit 311-1-1 inputs the differential pair of the first oscillation signal 31-1 and the third oscillation signal 31-3. SH circuit 311-1-2 inputs the differential pair of the second oscillation signal 31-2 and the fourth oscillation signal 31-4. Each of the SH circuits 311-1-1 and 311-1-2 inputs the reference signal 30 via a clock terminal of the SH circuit. Each of the SH circuits 311-1-1 and 311-1-2 samples differential input signals in response to a rising edge or a falling edge of the reference signal 30. That is, SH circuit 311-1-1 samples the first oscillation signal 31-1 and the third oscillation signal 31-3. SH circuit 311-1-2 samples the second oscillation signal 31-2 and the fourth oscillation signal 31-4. The SH circuits 311-1-1 and 311-1-2 output the sampled oscillation signals to the quantizers 311-2-1 and 311-2-2.

Quantizer 311-2-1 inputs the sampled first oscillation signal and the sampled third oscillation signal from SH circuit 311-1-1. Quantizer 311-2-1 compares the two input signals in magnitude to obtain TDC[1]. TDC[1] is one bit (1 or 0) contained in the first phase signal. Specifically, if the sampled first oscillation signal is greater than the sampled third oscillation signal, quantizer 311-2-1 outputs binary 0. If the sampled first oscillation signal is smaller than the sampled third oscillation signal, quantizer 311-2-1 outputs binary 1.

Quantizer 311-2-2 inputs the sampled second oscillation signal and the sampled fourth oscillation signal from SH circuit 311-1-2. Quantizer 311-2-2 compares the two input signals in magnitude to obtain TDC[0]. TDC[0] is one bit (1 or 0) contained in the first phase signal. Specifically, if the sampled second oscillation signal is greater than the sampled fourth oscillation signal, quantizer 311-2-2 outputs binary 0. If the sampled second oscillation signal is smaller than the sampled fourth oscillation signal, quantizer 311-2-2 outputs binary 1.

According to the example shown in FIG. 8 and FIG. 9, the first signal can be represented as TDC[1:0]. TDC[1:0] is associated with one of the phases of the four-phase oscillation signals 31. In FIG. 9, TDC[1:0] is associated with the phase difference between the reference signal 30 and the third oscillation signal 31-3 quantized at a resolution of $\pi/2$.

According to the example shown in FIG. 8 and FIG. 9, SH circuit 311-1-1 outputs the sampled first oscillation signal to a third control terminal of the controlled oscillator 330 as a third control signal. If the phase of the third oscillation signal 31-3 leads that of the reference signal 30, the third control signal functions as a DN signal which reduces the frequency of the third oscillation signal 31-3. Furthermore, if the phase of the third oscillation signal 31-3 lags that of the reference signal 30, the third control signal functions as an UP signal which increases the frequency of the third oscillation signal 31-3. The third control signal is effective for suppressing the degradation of the phase noise characteristics of the PLL circuit 300 caused by quantization noise generated by the quantizers 311-2-1 and 311-2-2.

The decoder 312 inputs the first phase signal from the SH-based TDC 311. The decoder 312 decodes (or converts) the first phase signal to obtain a second phase signal. The second phase signal is indicated by expressing, in two's complement notation, a value obtained by quantizing the phase at a resolution of $2\pi/2^m$. The decoder 312 outputs the second phase signal to the digital differentiator 313.

The digital differentiator 313 inputs the second phase signal from the decoder 312. The digital differentiator 313 differentiates the second phase signal to obtain a frequency signal indicative of the frequency of the oscillation signal 31. The digital differentiator 313 outputs the frequency signal to the digital subtractor 314.

The digital subtractor 314 inputs the frequency setting code and also inputs the frequency signal from the digital differentiator 313. The digital subtractor 314 calculates the difference between the frequency setting code and the frequency signal to obtain a digital frequency error signal indicative of a frequency error in the oscillation signal 31. The digital subtractor 314 outputs the frequency error signal to the digital integrator 321. Furthermore, the digital subtractor 314 outputs the frequency error signal to the digital correlator 370 as a monitor signal 33.

The digital integrator 321 inputs the frequency error signal from the digital subtractor 314. The digital integrator 321 integrates the frequency error signal to obtain a phase error signal indicative of a phase error in any one of the 2m-phase oscillation signals 31. The digital integrator 321 outputs the phase error signal to the gain adjustment unit 322. Here, the gain adjustment unit 322 and the digital integrator 323 described below form what is called an integral path.

The gain adjustment unit 322 inputs the phase error signal from the digital integrator 321. The gain adjustment unit 322 provides an adjustment gain (=$\rho$) to the phase error signal to obtain an adjustment signal. The gain adjustment unit 322 outputs the adjustment signal to the digital integrator 323.

The digital integrator 323 inputs the adjustment signal from the gain adjustment unit 322. The digital integrator 323 integrates the adjustment signal to obtain a first control signal. The digital integrator 323 outputs the first control signal to a first control terminal of the controlled oscillator 330 described below.

The controlled oscillator 330 is connected to the power supply 340 via the test signal application unit 362 described below. The controlled oscillator 330 comprises at least three control terminals including the first control terminal, a second control terminal, and the third control terminal. The controlled oscillator 330 inputs a first control signal from the digital integrator 323 via the first control terminal. The controlled oscillator 330 inputs a second control signal from the power supply noise canceller 390 described below via the second control terminal. The controlled oscillator 330 inputs a third control signal from the SH-based TDC 311 via the third control terminal.

The controlled oscillator 330 generates the oscillation signal 31 with a frequency corresponding to the signal value of an input signal to each of the control terminals of the controlled oscillator 330. For example, if the controlled oscillator 330 is a VCO, the oscillation signal 31 has a frequency corresponding to the voltage of an input signal to each of the control terminals of the controlled oscillator 330. The controlled oscillator 330 is, for example, a ring oscillator which can easily extract a multiphase oscillation signals, but is not limited to this. The controlled oscillator 330 outputs the 2m-phase oscillation signals 31 to the SH-based TDC 311 via an output terminal of the controlled oscillator 330. The frequency of the oscillation signal 31 is feedback-controlled so as to reduce the above-described frequency error. Moreover, the controlled oscillator 330 outputs any one or more of the 2m-phase oscillation signals 31 to the outside of the PLL circuit 300 via the output terminal.

The power source 340 supplies a power supply voltage to the controlled oscillator 330 via the test signal application unit 362. The test signal generation unit 350 described below does not operate until the PLL converges. Thus, the test signal application unit 362 is negligible.

The convergence of the PLL is followed by activation of the power supply noise cancellation loop. Specifically, the convergence of the PLL is followed by activation of the test signal generation unit 350, the DAC 361, the test signal application unit 362, the digital correlator 370, the digital integrator 380, and the power supply noise canceller 390. The convergence of the power supply noise cancellation loop completes the calibration of the power supply noise canceller 390.

The test signal generator 350 is formed using a digital circuit. The test signal generation unit 350 generates a digital test signal 32. The test signal generation unit 350 outputs the test signal 32 to the DAC 361 and the digital correlator 370. Like the test signals 12 and 22, the test signal 32 may be generated so as to have a frequency higher than the loop band and any waveform such as a square wave, a triangle wave, or a sine wave.

The DAC 361 inputs the digital test signal 32 from the test signal generation unit 350. To apply the test signal 32 to the power supply voltage, the DAC 361 converts the test signal 32 into an analog test signal. The DAC 361 outputs the analog test signal to the test signal application unit 362.

The test signal application unit 362 inputs the analog test signal from the DAC 361. The test signal application unit 362 applies the analog test signal to the power supply voltage to be supplied to the controlled oscillator 330 by the power supply 340. As a result, the frequency of the oscillation signal 31 varies periodically depending on the frequency of the test signal 32.

The digital correlator 370 is formed using a digital circuit. The digital correlator 370 inputs the digital frequency error signal from the digital subtractor 314 as the digital monitor signal 33. The digital correlator 370 inputs the digital test signal 32 from the test signal generation unit 350. The digital correlator 370 calculates a correlation value for the test signal 32 and the monitor signal 33 to obtain a digital correlation signal indicative of the correction value. The digital correlator 370 outputs the correlation signal to the digital integrator 380.

The digital integrator 380 is formed using a digital circuit. The digital integrator 380 inputs the digital correlation signal from the digital correlator 370. The digital integrator 380 integrates the correlation signal to obtain a digital integral signal indicative of the integral value of the correlation signal. The digital integrator 380 outputs the integral signal to the power supply noise canceller 390. The digital integrator 380 suppresses the frequency components other than a direct current component. Thus, those frequency components of the power supply noise which are different from the frequency components of the test signal 32 are basically negligible. The direct current component of the correlation signal approaches zero as the calibration progresses. A zero direct current component of the correlation signal means a zero amplitude of the monitor signal 33. This means that the frequency of the oscillation signal 31 is stabilized in spite of a variation in power supply voltage due to the test signal 32 and the power supply noise, resulting in the convergence of the power supply noise cancellation loop.

The power supply noise canceller 390 inputs the power supply voltage with the test signal 32 applied thereto by the DAC 361 and the test signal application unit 362. The power supply noise canceller 390 provides a cancellation gain to the power supply voltage with the test signal applied thereto, to obtain a second control signal. The cancellation gain is controlled by the digital integral signal from the digital integrator 380. The power supply noise canceller 390 outputs the second control signal to the second control terminal of the controlled oscillator 330.

As described above, the PLL circuit according to the third embodiment extracts the frequency error signal as the monitor signal. Hence, the PLL circuit provides the available test signal with a high frequency. That is, the PLL circuit allows a wide band to be set for the integrator in the power supply noise cancellation loop, enabling a reduction in the calibration time of the power supply noise canceller. Furthermore, even if the test signal contains harmonic components, the PLL circuit suppresses the degradation of the phase noise characteristics caused by the harmonic components. Moreover, in the PLL circuit, the test signal generation unit, digital correlator, and digital integrator included in the power supply noise cancellation loop are formed using digital circuits. Hence, the PLL circuit allows the area and power consumption thereof to be reduced more easily than when the test signal generation unit, the digital correlator, and the digital integrator are formed using analog circuits. Moreover, the SH-based TDC is incorporated in the PLL circuit. Therefore, the PLL circuit suppresses the degradation of the phase noise characteristics resulting from quantization noise.

Fourth Embodiment

As illustrated in FIG. 11, a PLL circuit 500 according to a fourth embodiment comprises an SH-based TDC 311, a decoder 312, a digital differentiator 313, a digital subtractor 314, a digital integrator 321, a gain adjustment unit 322, a digital integrator 323, a controlled oscillator 330, a power supply 340, a test signal generation unit 551, a divergence determination unit 552, a DAC 361, a test signal application unit 362, a digital correlator 370, a digital integrator 380, and a power supply noise canceller 390. Some or all of those of the elements of the PLL circuit 500 which overlap elements of the PLL circuit 300 may be replaced with corresponding elements of the PLL circuit 100 or the PLL circuit 200.

The conversion of a PLL is followed by activation of a power supply noise cancellation loop. Specifically, the conversion of the PLL is followed by activation of the test signal generation unit 551, the divergence determination unit 552, the DAC 361, the test signal application unit 362, the digital correlator 370, the digital integrator 380, and the power supply noise canceller 390. The convergence of the power supply noise cancellation loop completes the calibration of the power supply noise canceller 390.

The test signal generation unit 551 is formed using a digital circuit. The test signal generation unit 551 generates a digital test signal 32. The test signal generation unit 551 outputs the test signal 32 to the DAC 361 and the digital correlator 370. Upon inputting a phase adjustment signal from the divergence determination unit 552 described below, the test signal generation unit 551 shifts the phase of the test signal 32 by $\pi/2$.

The divergence determination unit 552 monitors a digital integral signal supplied to the power supply noise canceller 390 by the digital integrator 380. The divergence determination unit 552 compares the digital integral signal with a threshold value to determine whether or not a cancellation gain diverges. Upon determining that the cancellation gain diverges, the divergence determination unit 552 outputs the phase adjustment signal to the test signal generation unit 551.

Figure 12:
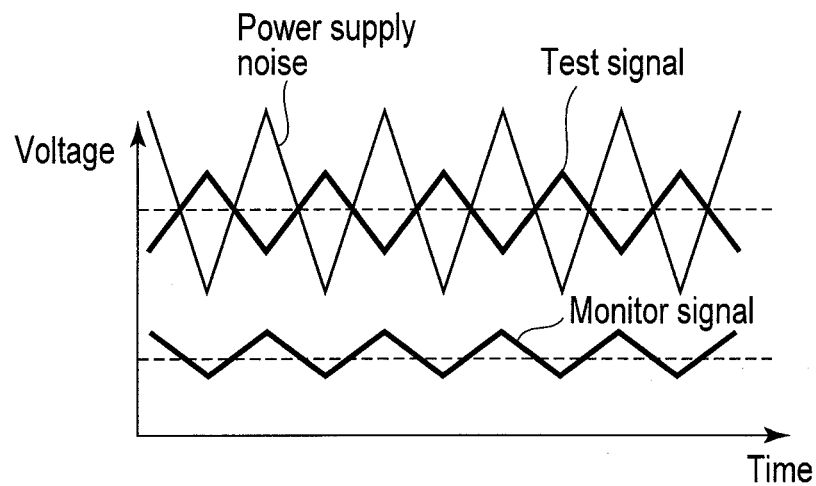
FIG. 12 is a diagram illustrating the state of a test signal, power supply noise, and a monitor signal observed when a cancellation gain diverges.
Figure 13:
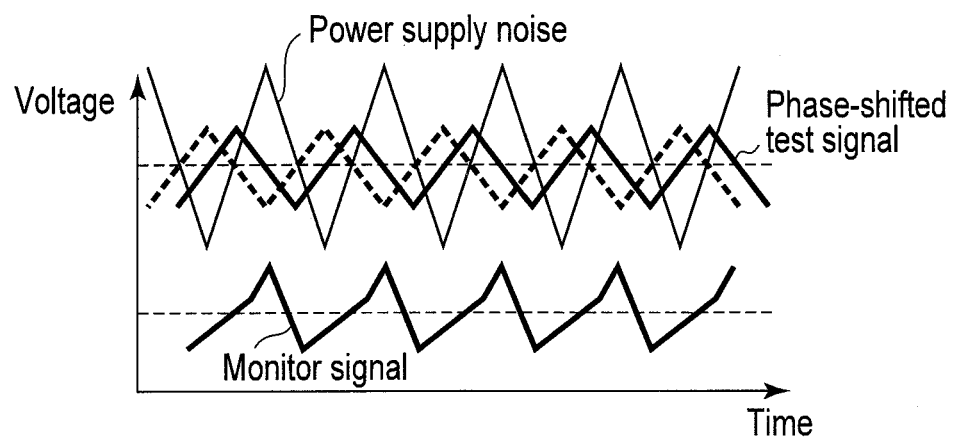
FIG. 13 is a diagram illustrating the state of a monitor signal observed when the test signal in FIG. 12 is shifted.

In the power supply noise cancellation loop, various types of power supply noise as well as the test signal 32 may be applied to a power supply voltage. For example, a type of power supply noise with the same frequency as the frequency of the test signal 32 and a phase opposite to the phase of the test signal 32 may be applied to the power supply voltage. If the amplitude of this power supply noise is greater than that of the test signal 32, a monitor signal 33 has a phase opposite to the phase of the test signal 32, as illustrated in FIG. 12. If the monitor signal 33 has a phase opposite to the phase of the test signal 32, a correlation value for the monitor signal 33 and the test signal 32 is negative. Eventually, the integral value of a digital correlation signal may be negative. That is, the cancellation gain may diverge without convergence (that is, the cancellation gain may have a positive value). In such a case, the phase of the test signal 32 is shifted as illustrated in FIG. 13 so that the monitor signal 33 has an in-phase component with the test signal 32, resulting in a positive correlation value. This allows the cancellation gain to converge.

As described above, the PLL circuit according to the fourth embodiment determines whether or not the cancellation gain diverges. If the cancellation gain diverges, the PLL circuit shifts the phase of the test signal. Thus, the PLL circuit allows the cancellation gain to converge even in an environment with loud power supply noise.

Fifth Embodiment

Figure 10:
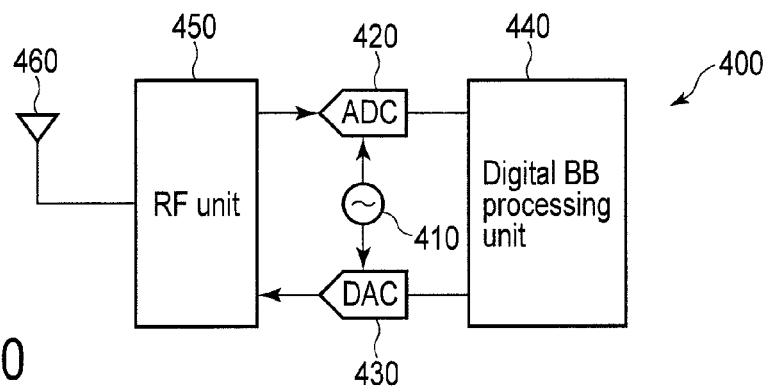
FIG. 10 is a diagram illustrating a communication apparatus according to a fifth embodiment.

A communication apparatus according to a fifth embodiment may comprise a PLL circuit according to any one of the above-described first to fourth embodiments incorporated therein. A communication apparatus 400 according to the present embodiment is illustrated in FIG. 10. The communication apparatus 400 includes a PLL circuit 410, an analog-to-digital converter (ADC) 420, a DAC 430, a digital baseband (BB) processing unit 440, an RF unit 450, and an antenna 460.

The PLL circuit 410 is a PLL circuit according to any one of the above-described first to fourth embodiments. The PLL circuit 410 performs clock control on the ADC 420 and the DAC 430. The clock control is performed using, for example, the above-described oscillation signal 11.

The digital BB processing unit 440 carries out processing such as encoding and decoding. For example, for transmission, the digital BB processing unit 440 generates and outputs a digital transmission signal to the DAC 430. Furthermore, for reception, the digital BB processing unit 440 inputs a digital reception signal from the ADC 420.

The ADC 420 is subjected to the clock control by the oscillation signal 11 from the PLL circuit 410. The ADC 420 inputs a baseband reception signal from the RF unit 450 and converts the baseband reception signal into a digital reception signal. The ADC 420 outputs the digital reception signal to the digital BB processing unit 440.

The DAC 430 is subjected to the clock control by the oscillation signal 11 from the PLL circuit 410. The DAC 430 inputs the digital transmission signal from the digital BB processing unit 440 and converts the digital transmission signal into a baseband transmission signal. The DAC 430 outputs the baseband transmission signal to the RF unit 450.

The RF unit 450 carries out processing such as filtering, upconversion, downconversion, low-noise amplification, and power amplification. For example, for transmission, the RF unit 450 processes the baseband transmission signal from the DAC 430 to obtain an RF transmission signal. The RF unit 450 outputs the RF transmission signal to the antenna 460. Furthermore, for reception, the RF unit 450 processes an RF reception signal from the antenna 460 to obtain the baseband reception signal. The RF unit 450 outputs the baseband reception signal to the ADC 420.

The antenna 460 radiates the RF transmission signal from the RF unit 450 to space and outputs the RF reception signal to the RF unit 450.

As described above, the communication apparatus according to the fifth embodiment includes the PLL circuit according to any one of the first to fourth embodiments. Thus, the communication apparatus exerts effects which are the same as or similar to the effects of any one of the first to fourth embodiments. For example, the communication apparatus shortens the calibration time of the power supply noise canceller to speed up the activation of the PLL circuit, thus increasing the efficiency of data processing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A phase locked loop (PLL) circuit comprising:
a controlled oscillator configured to comprise at least a first control terminal and a second control terminal and to generate an oscillation signal with a frequency corresponding to a first control signal and a second control signal which are input via the first control terminal and the second control terminal, respectively;
a frequency comparison unit configured to compare a reference signal with the oscillation signal to obtain a frequency error signal indicative of an error in a frequency of the oscillation signal with respect to a desired value;
a loop gain adjustment unit configured to adjust gain of the frequency error signal to obtain the first control signal;
a generation unit configured to generate a test signal with a frequency higher than a loop band of a PLL formed by the controlled oscillator, the frequency comparison unit, and the loop gain adjustment unit after the PLL converges;
an application unit configured to apply the test signal to a power supply voltage to be supplied to the controlled oscillator;
a correlator configured to extract the frequency error signal as a monitor signal and to calculate a correlation value for the test signal and the monitor signal to generate a correlation signal;
an integrator configured to integrate the correlation signal to generate an integral signal; and
a power supply noise canceller configured to provide a cancellation gain corresponding to the integral signal to the power supply voltage to which the test signal is applied, to generate the second control signal.

2. The circuit according to claim 1, further comprising:
a digital-to-analog converter (DAC) configured to convert a digital test signal with a frequency higher than the loop band into an analog test signal,
wherein the frequency comparison unit comprises:
a time-to-digital converter (TDC) configured to detect a phase of the oscillation signal in response to a rising edge or a falling edge of the reference signal to obtain a phase signal indicative of the phase;
a digital differentiator configured to differentiate the phase signal to obtain a frequency signal indicative of the frequency of the oscillation signal; and
a digital subtractor configured to calculate a difference between the frequency signal and a frequency setting code indicative of a ratio of the desired value to a frequency of the reference signal to obtain a digital frequency error signal,
the loop adjustment unit comprises:
a first digital integrator configured to integrate the digital frequency error signal to obtain a phase error signal;
a first gain adjustment unit configured to provide a first adjustment gain to the phase error signal to obtain a first adjustment signal;
a second gain adjustment unit configured to provide a second adjustment gain to the phase error signal to obtain a second adjustment signal;
a second digital integrator configured to integrate the second adjustment signal to obtain a third adjustment signal; and
a digital adder configured to add the first adjustment signal and the third adjustment signal together to obtain the first control signal,
the generation unit is formed using a digital circuit and generates the digital test signal after the PLL converges,
the application unit applies the analog test signal to the power supply voltage,
the correlator is formed using a digital circuit, extracts the digital frequency error signal as a digital monitor signal, and calculates a correlation value for the digital test signal and the digital monitor signal to generate a digital correlation signal, the integrator is formed using a digital circuit and integrates the digital correlation signal to generate a digital integral signal, and the power supply noise canceller provides a cancellation gain corresponding to the digital integral signal to the power supply voltage to which the analog test signal is applied, to generate the second control signal.

3. The circuit according to claim 1, further comprising:

a digital-to-analog converter (DAC) configured to convert a digital test signal with a frequency higher than the loop band into an analog test signal, wherein the controlled oscillator comprises at least the first control terminal, the second control terminal, and a third control terminal, and generates 2m-phase (m is an integer of at least two) oscillation signals with a frequency corresponding to the first control signal, the second control signal, and a third control signal which are input via the first control terminal, the second control terminal, and the third control terminal, respectively, the frequency comparison unit comprises:

a sample-and-hold (SH)-based time-to-digital converter (TDC) configured to sample the 2m-phase oscillation signals in response to a rising edge or a falling edge of the reference signal, to detect a phase of one of sampled 2m-phase oscillation signals to obtain a first phase signal with m bits which is indicative of the phase, and to output one of the sampled 2m-phase oscillation signals as the third control signal, a decoder configured to decode the first phase signal to obtain a second phase signal;

a digital differentiator configured to differentiate the second phase signal to obtain a frequency signal indicative of the frequency of the 2m-phase oscillation signals; and a digital subtractor configured to calculate a difference between the frequency signal and a frequency setting code indicative of a ratio of the desired value to a frequency of the reference signal to obtain a digital frequency error signal, the loop gain adjustment unit comprises:

a first digital integrator configured to integrate the digital frequency error signal to obtain a phase error signal;

a gain adjustment unit configured to provide an adjustment gain to the phase error signal to obtain an adjustment signal; and a second digital integrator configured to integrate the adjustment signal to obtain the first control signal, the generation unit is formed using a digital circuit, and generates the digital test signal after the PLL converges, the application unit applies the analog test signal to the power supply voltage, the correlator is formed using a digital circuit, extracts the digital frequency error signal as a digital monitor signal, and calculates a correlation value for the digital test signal and the digital monitor signal to generate a digital correlation signal, the integrator is formed using a digital circuit and integrates the digital correlation signal to generate a digital integral signal, and the power supply noise canceller provides a cancellation gain corresponding to the digital integral signal to the power supply voltage to which the analog test signal is applied, to generate the second control signal.

4. The circuit according to claim 1, further comprising:

a determination unit configured to compare the integral signal with a threshold value to determine whether or not the cancellation gain diverges and to output a phase adjustment signal to the generation unit if the cancellation gain diverges, wherein the generation unit shifts a phase of the test signal in accordance with the phase adjustment signal.

5. A communication apparatus comprising:

the circuit according to claim 1;

a digital-to-analog converter (DAC) configured to be subjected to clock control by the oscillation signal to convert a digital transmission signal into a baseband transmission signal;

an analog-to-digital converter (ADC) configured to be subjected to clock control by the oscillation signal to convert a baseband reception signal into a digital reception signal;

a digital baseband processing unit configured to process the digital transmission signal and the digital reception signal; and an RF processing unit configured to process the baseband transmission signal and the baseband reception signal.

* * * * *